US012640333B2

(12) United States Patent
Saghayezhian et al.

(10) Patent No.: US 12,640,333 B2
(45) Date of Patent: May 26, 2026

(54) GRID SURFACE CONDITIONING FOR ION BEAM SYSTEM

(71) Applicant: VEECO INSTRUMENTS INC., Plainview, NY (US)

(72) Inventors: Mohammad Saghayezhian, Plainview, NY (US); Binyamin Rubin, Plainview, NY (US); Kirill Gutsol, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 209 days.

(21) Appl. No.: 18/504,438

(22) Filed: Nov. 8, 2023

(65) Prior Publication Data

US 2024/0203683 A1     Jun. 20, 2024

Related U.S. Application Data

(60) Provisional application No. 63/387,569, filed on Dec. 15, 2022.

(51) Int. Cl.
H01J 37/147          (2006.01)
(52) U.S. Cl.
CPC .................................. H01J 37/147 (2013.01)

(58) Field of Classification Search
None
See application file for complete search history.

(56) References Cited

U.S. PATENT DOCUMENTS

| | | | |
|---|---|---|---|
| 6,464,891 B1 * | 10/2002 | Druz ..................... | C23C 14/221 |
| | | | 134/1 |
| 10,014,164 B2 | 7/2018 | Druz et al. | |
| 2012/0080609 A1 * | 4/2012 | Kameyama ............. | H01J 37/09 |
| | | | 29/592 |
| 2020/0051783 A1 | 2/2020 | Baltz et al. | |
| 2023/0031722 A1 * | 2/2023 | Yang ....................... | H01J 37/08 |
| 2023/0230793 A1 * | 7/2023 | Hopf ....................... | G21B 1/11 |
| | | | 250/424 |

* cited by examiner

*Primary Examiner* — Binh X Tran
(74) *Attorney, Agent, or Firm* — HOLZER PATEL DRENNAN

(57) ABSTRACT

An in situ cleansing of grids of an ion beam system, such as a deposition and/or etching system, that includes applying a negative bias on the downstream-most grid and etching redeposited material from the grid. Any or all of the chamber pressure of the system, the extraction current in the ion beam source, the beam divergence, and perveance can be adjusted with the deceleration grid bias. The methods of this disclosure can be applied to any gridded ion source systems, including those with an assist ion beam.

21 Claims, 4 Drawing Sheets

300

GRID SURFACE CONDITIONING FOR ION BEAM SYSTEM

CROSS REFERENCE

This application claims priority to U.S. provisional application Ser. No. 63/387,569 filed Dec. 15, 2022 and titled GRID SURFACE CONDITIONING FOR ION BEAM SYSTEM, the entire disclosure of which is incorporated herein by reference for all purposes.

BACKGROUND

In plasma ion beam applications (in either or both ion beam deposition and ion beam etching), back sputtered materials are deposited and accumulated on the downstream surface of the grids. Overtime, this leads to premature failure of grids due to sputtered materials delaminating or flaking, which in turn becomes a source of grid arcing and/or defect generation.

SUMMARY

The present disclosure is directed to an in situ cleansing of grids of an ion deposition/etching system that includes applying a negative bias on the downstream-most grid and etching redeposited material from the grid. Any or all of the chamber pressure of the system, the extraction current in the ion beam source, the beam divergence, and perveance can be adjusted with the grid bias. The methods of this disclosure can be applied to any gridded ion source systems, including those with an assist ion beam.

The methods are particularly suitable for ion beam systems or sources that operate at high pressure, high power, and high sputtering rate. Under these conditions, a considerable amount of sputtered material is typically accumulated on the etch or deposition grids, leading to shorter lifetime and requiring more frequent maintenance, thus decreasing the system uptime and operation potential, and ultimately increasing cost of ownership of the system. With the methods described herein, system downtime is decreased, increasing productivity and reducing operation cost. The methods can be done during or in between substrate processing.

The disclosure describes, in one particular embodiment, a method of conditioning a grid in an ion beam system by applying a negative bias to a deceleration grid in the ion beam system, providing a broad and defocused ion beam through the negative biased deceleration grid, and etching redeposited material off of the deceleration grid.

This Summary is provided to introduce a selection of concepts in a simplified form that are further described below in the Detailed Description. This Summary is not intended to identify key or essential features of the claimed subject matter, nor is it intended to be used to limit the scope of the claimed subject matter. These and various other features and advantages will be apparent from a reading of the following Detailed Description.

DETAILED DESCRIPTION

Figure 1:
FIG. 1 is a schematic side view of a portion of an ion beam deposition system.
Figure 1:
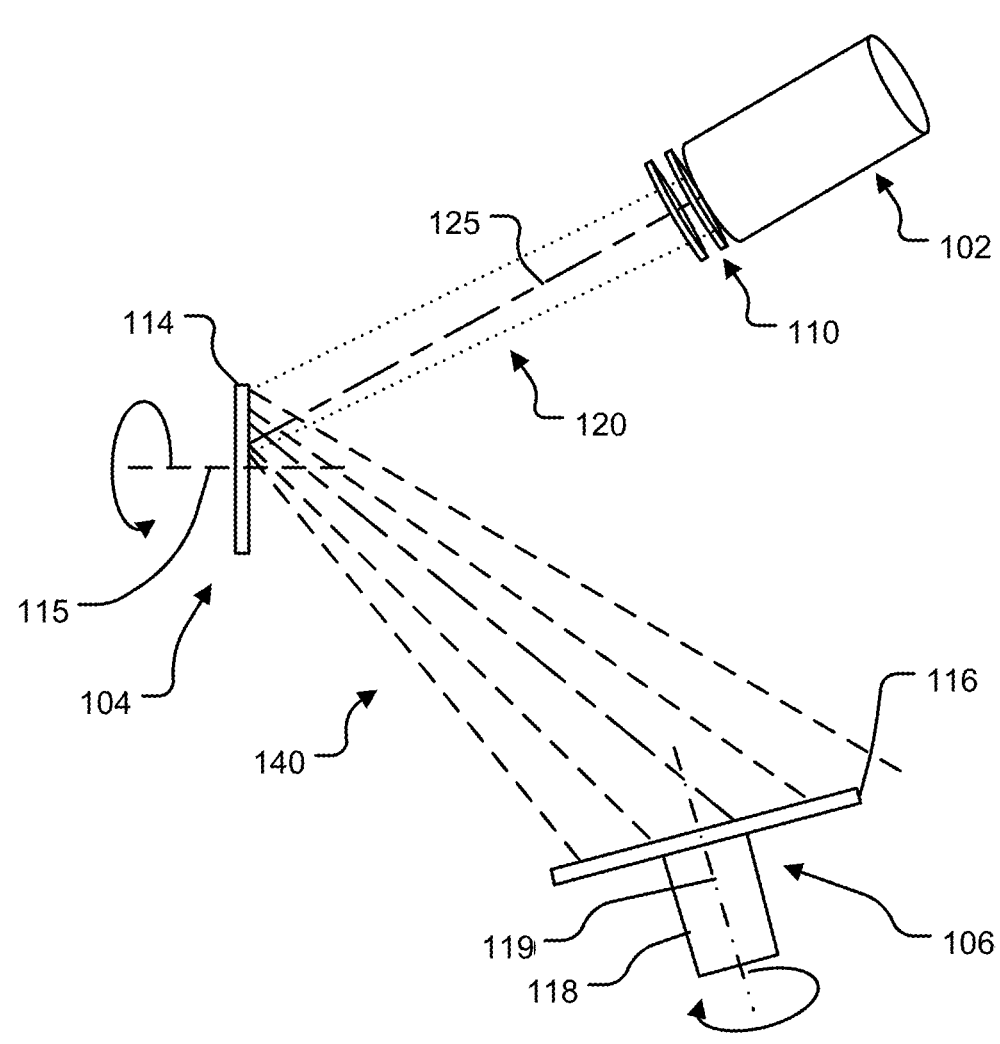

This disclosure is directed to methods for in situ cleaning and conditioning of ion beam systems, such as ion deposition systems. The methods provide a conditioning process of the grid(s) by gradually etching the surface of the grids, removing deposited materials from the surface of the grid, mitigating the risk of system contamination due to delamination and/or flaking of any redeposited material. The methods also provide a texturing process of the grid(s), increasing surface roughness. The methods utilize a negatively biased grid, typically, the deceleration grid closest to the sputter target, which is usually grounded during operation of the system. With the negatively biased grid and increased chamber pressure and/or beam broadening, redeposited material is removed from the grid(s). Thus, the life of the grid(s) is increased and system throughput is improved.

The methods can be applied to sources with two or more grids. Most ion sources utilize three grids, which, in the order of plasma direction upstream to downstream, are called screen/accelerator/decelerator grids or screen/acceleration/deceleration grids or beam/suppressor/ground grids.

In operation of the methods, the charge exchange ions in proximity of the now-negatively biased deceleration grid are increased, e.g., maximized, and accelerate towards the grid surface, impinging on the surface and etching away the materials at the grid surface. There is no deleterious effect on the grid(s) during these controlled etching procedures. The optical parameters of the grids, such as hole/aperture diameter, plate thickness and grid gaps, remain essentially unaffected, with no measurable change in dimension.

The cleaning methods described herein, conducted under controlled parameters as described and without breaking the vacuum on the system, do not create grid-emanated particulate or other solid contaminants that would contaminate the deposition system. In fact, because the materials etched from the grid are the same materials as deposited on the substrate, the overall cleanliness of the deposition system is maintained.

As no breaking of the system vacuum is required, operation downtime of the system is reduced. The conditioning can be done during or in between substrate processing. Additionally, periodic in situ grid conditioning, per these methods, can not only considerably prolong the average time between more extensive system maintenance, but can inhibit unplanned system shut down resulting from contamination. By grid conditioning, at regular intervals, the ambiguity in determining best time for performing maintenance is removed, as the thickness of the redeposited material can be controlled and maintained below a desired level.

The methods of this disclosure can be applied to any gridded ion sources, including those with an assist ion beam. The methods are particularly suitable for ion systems or sources that operate at high pressure, high power, and high sputtering rate. Under these conditions, a considerable amount of sputtered material is typically accumulated on the etch or deposition grids, leading to shorter lifetime and requiring more frequent maintenance, thus decreasing the system uptime and operation potential, and ultimately increasing cost of ownership of the system.

Conventionally, grid plates are conditioned/cleaned ex situ by sand/bead blasting, chemical etch, or laser treating. It is also known to coat the grid surface with a protective layer having a predictable erosion rate to control the accumulation of build-up. Such conditioning and coating techniques both need to be customized for each different sputtered material because the stress and critical thickness, before delamination or flaking, is an inherent property of that material. Also, both techniques require breaking the vacuum of the ion beam system; interrupting the operation of the deposition/etch system to provide ex situ grid treatment leads to increased cost of ownership. Therefore, in conventional methods, depending on the sputter target material, e.g., metallic or insulating, e.g., with high or low adhesion, different types of grid surface treatment(s) and/or coating(s) are required, all which reduce system productivity. With the in situ cleaning methods described herein, the uptime is increased, increasing productivity and reducing operation cost.

In the following description, reference is made to the accompanying drawing that forms a part hereof and in which is shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below. In some instances, a reference numeral may have an associated sub-label consisting of a lower-case letter to denote one of multiple similar components. When reference is made to a reference numeral without specification of a sub-label, the reference is intended to refer to all such multiple similar components.

FIG. 1 illustrates a generic diagram of an ion beam system 100. Even though the implementation of the ion beam system 100 is shown as an ion beam sputter deposition system, components of the ion beam system 100 may also be used with some alteration for implementing any or all of an ion beam etch system, an ion implantation system, an ion beam deposition system, an ion beam assisted deposition system, etc. The system 100 can be used to, e.g., deposit, deposit and modify, and/or deposit and etch material.

The ion beam system 100 includes an ion beam source 102, a target assembly 104, and a substrate assembly 106 for supporting a substrate 116. The substrate assembly 106 may include a single large substrate 116, as shown in FIG. 1, or may include a sub-assembly holder that holds multiple smaller individual substrates 116. The substrate 116 may be formed of, for example, one or more layers of silicide(s), nitride(s), oxide(s), metal(s) including alloys, or ceramic(s).

The ion beam source 102 generates an ion beam 120, which can include a plurality of ion beamlets targeted or directed toward the target assembly 104, which includes at least one target 114 affixed to the target assembly 104 that includes a material desired to be deposited on the substrate 116. The ion beam 120 has a centerline axis 125 that is targeted or directed toward the target 114 such that the ion beam 120 completely or near completely impinges on the target 114. The target 114 is located on a platform of the target assembly 104 that, if needed, can rotate the target 114 about a given axis 115. In some designs, the target 114 may tilt. The ion beam 120, upon striking the target 114, generates a sputter plume 140 of material from the target 114.

Examples of material for the target 114 include, without limitation, metals such as titanium (Ti), tungsten (W), molybdenum (Mo), tantalum (Ta), ruthenium (Ru), cobalt (Co), copper (Cu), and rhodium (Rh), dielectric and semiconductor materials such as, but not limited to, nitrides of metals and semiconductors such as titanium nitride (TiN), tantalum nitride, (TaN) silicon nitride ($Si_3N_4$), molybdenum nitride (MoN), tungsten nitride (WN, $W_2N$, $WN_2$), oxides of metals and semiconductors such as silicon oxide ($SiO_2$), titanium oxide (TiO), aluminum oxide ($Al_2O_3$), silicides of metals and semiconductors such as tungsten silicide ($W_5Si_3$), molybdenum silicide ($MoSi_2$), titanium silicide ($Ti_5Si_3$), and other types of metal, dielectric, and semiconductor targets.

The ion beam 120 strikes the target 114 at such an angle so that the sputter plume 140 generated from the target 114 travels towards the substrate assembly 106 and the substrate 116. In some configurations of the ion beam system 100, the sputter plume 140 is divergent as it travels from the target 114 towards the substrate assembly 106 and may partially overspray the substrate 116. However, in other configurations, the sputter plume 140 may be made more or less concentrated so that its resulting deposition of material is more effectively distributed over a particular area of the substrate 116.

The substrate assembly 106 is located and oriented such that the sputter plume 140 strikes the substrate 116 at a desired angle as well. In one example configuration of the ion beam system 100, the substrate assembly 106 is attached to a fixture 118 that allows the substrate assembly 106 to be moved in a desired manner, including rotation of the substrate assembly 106 about its axis 119 or pivoting the fixture 118 to tilt the substrate 116 to alter its angle with respect to the sputter plume 140.

In one example of the ion beam system 100, the ion source 102 generates ions that are positively charged. However, in an alternate example, the ion source 102 generates ions that are negatively charged. The subsequent disclosure herein assumes that the ions generated by the ion source 102 are positively charged. The ion source 102 may be a DC type, a radio frequency (RF) type or a microwave type gridded ion source.

The system 100 may include one or more grids 110 proximate the ion beam source 102 for directing the ion beam 120 from the ion beam source 102 to the target assembly 104. In one configuration of the ion beam system 100, the grids 110 steer the ion beamlets such that the ion beam 120 is divergent from the centerline axis 125 of the ion beam source 102, compared to if no bulk ion beam steering was provided. In an alternate configuration, the grids 110 steer the ion beamlets such that the ion beam 120 is not divergent from the centerline axis 125. Other constructions and configurations may also be provided. The grids 110 can cause the ion beam 120 to have a symmetric or asymmetric cross-sectional profile around a beam axis.

The grids 110 have holes or apertures therethrough to allow the beamlets of the ion beam 120 to pass through the grids 110. The individual holes in the grids 110 may be positioned to yield the highest density of holes per area to maximize ions extracted from the ion source 102. The grids 110 may have a rectilinearly or elliptically shaped pattern of holes.

As indicated above, the system 100 shown is a generic and generalized system. The system 100 may include any additional features, such as a reactive gas source, an assist ion source, an assist gas source, various heaters, neutralizers, turrets for multiple rotational targets, and diagnostic probes and sensors.

The system 100 may operate at any conventional operating parameters under any operating conditions. For example, the system 100 may be under inert atmosphere, may have a reactive gas added and/or a noble gas. For example, introduction of gases may be as low as 1 sccm to as high as 100 sccm. The system 100 typically operates at a process (chamber) pressure of less than $10^{-3}$ torr, e.g., $1 \times 10^{-5}$ to $1 \times 10^{-3}$ torr. The system 100, particularly the ion beam source 102, can utilize a high energy ion beam, e.g., having a voltage ranging from 40 V to 2000 V. The system can provide a net deposition rate greater than 10 angstroms/minute, sometimes greater than 100 angstroms/minute.

Figure 2:
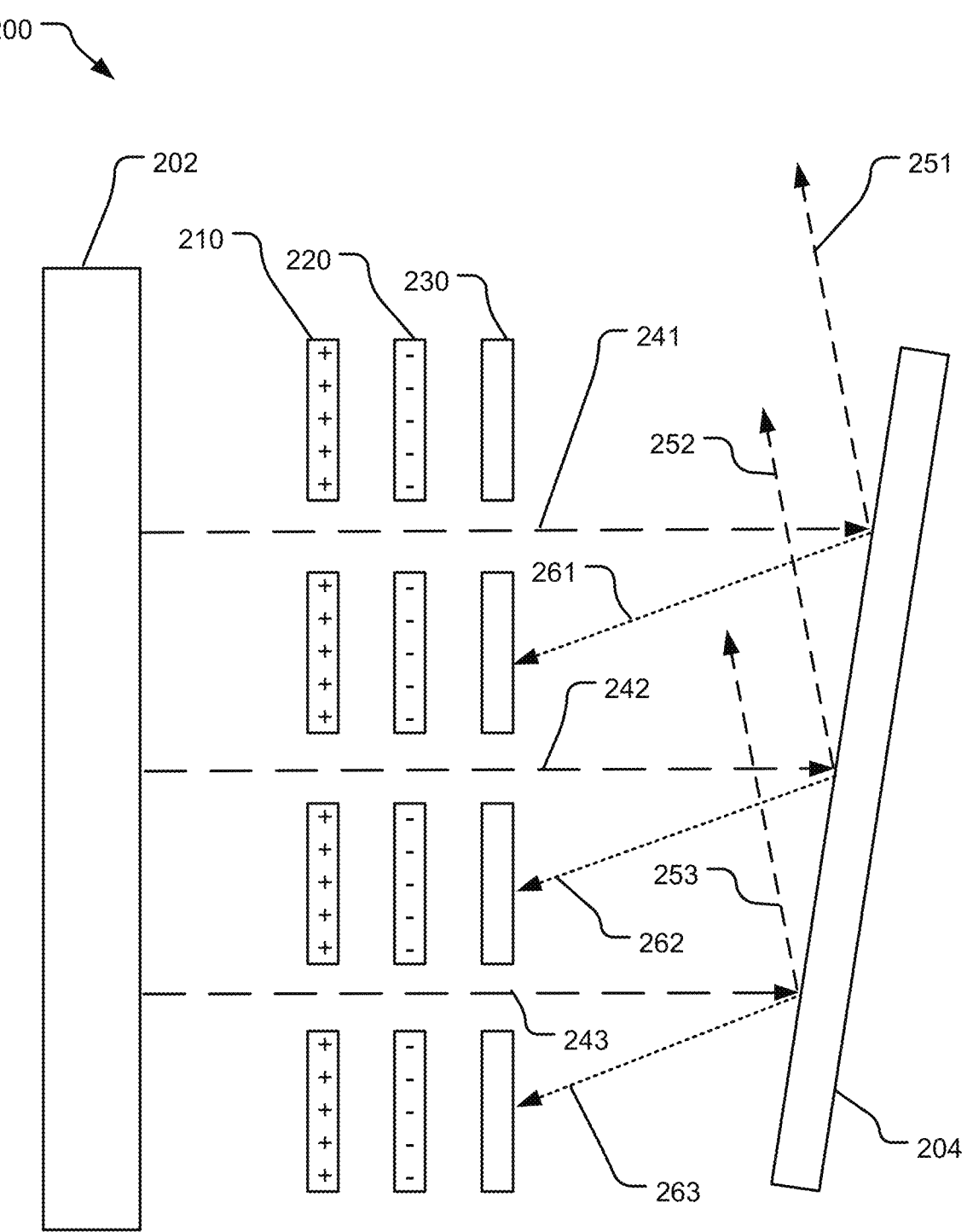
FIG. 2 is a schematic side view of three grids from an ion beam deposition system.

FIG. 2 illustrates an example grid assembly 200 used in an ion beam system such as the system 100. In this design, the grid assembly 200 includes an ion source 202 and a target 204, and at least one grid positioned therebetween. Specifically, the assembly 200 has three grids, a screen grid 210, an acceleration grid 220, and a deceleration grid 230, shown in a cross-sectional view, although it should be understood that different combinations of grids may be used, including configurations having a larger number or a fewer number of grids. In one design, the grids are planar and circular in shape, with each grid having a substantially similar diameter, although other shapes are contemplated, including a concave or a convex dished shape.

As shown in FIG. 2, the three grids 210, 220, 230 are positioned parallel to one another with equal distance between the grids. While the grids are shown positioned parallel to one another and equidistant, this characteristic is not required; for example, in some designs the distance between the first two grids is less than the distance between the last two grids. The grids 210, 220, 230 have an array of corresponding holes, three being shown in each grid 210, 220, 230 in FIG. 2.

The grids 210, 220, 230 are positioned such that the screen grid 210 forms the downstream boundary of a discharge chamber of an ion beam source 202. The discharge chamber generates a plasma (e.g., from a noble gas such as argon or from a non-noble gas such as oxygen, nitrogen, or methane), and the grids 210, 220, 230 extract and accelerate ions from the plasma through the grid holes toward the target 204. The ions from the source 202 are organized in an ion beam composed of individual beamlets, where a beamlet is composed of ions accelerating through individual sets of corresponding holes in the grids 210, 220, 230.

In practice, individual ions of each beamlet flood generally along a center axis through a hole in the screen grid 210 in a distribution across the open area of the hole. The beamlet ions continue to accelerate toward the acceleration grid 220, flooding generally along a center axis through a corresponding hole of the acceleration grid 220. Thereafter, the momentum imparted by the electric field between the screen grid 210 and the acceleration grid 220 on the beamlet ions propels them generally along a center axis through a hole in the deceleration grid 230 in a distribution across the open area of the hole and toward the downstream positioned target 204.

Each of the grids 210, 220, 230 is operably connected to a voltage source to independently apply a voltage bias to each of the grids 210, 220, 230.

The screen grid 210 is closest to the ion source 202 and is therefore the first grid to receive the emission of ions from the discharge chamber. As such, the screen grid 210 is upstream of the acceleration grid 220 and the deceleration grid 230. The screen grid 210 is marked with plus (+) signs, representing the screen grid 210 as being positively charged or biased.

The acceleration grid 220 is positioned immediately downstream of the screen grid 210 in FIG. 2. As such, the acceleration grid 220 is downstream of the ion source 202 and the screen grid 210 and upstream of the deceleration grid 230. The acceleration grid 220 is marked with minus (−) signs, representing the acceleration grid 220 as being negatively charged or biased. A negative bias on the acceleration grid 220 extracts the ions from the plasma and through the holes in the screen grid 210.

The deceleration grid 230 is positioned immediately downstream of the acceleration grid 220 in FIG. 2. As such, the deceleration grid 230 is downstream of the ion source 202, the screen grid 210 and the acceleration grid 220 and upstream of the target 204. The deceleration grid 230 is typically grounded.

FIG. 2 shows three ions 241, 242, 243 passing through adjacently positioned holes in the three grids 210, 220, 230 and colliding into the surface of the target 204. However, it should be understood that the three ions 241, 242, 243 generally represent a distribution of ions flooding through the holes in the three grids 210, 220, 230.

As ions pass through holes in the deceleration grid 230, the ions collide into the downstream positioned sputter target 204. As the ions collide with the surface of the target 204, an amount of material from the target 204 separates from the surface of the target 204, traveling in a plume toward another work piece, such as a substrate (not shown); these plumes are shown as plumes 251, 252, 253.

An amount of material from the target 204 also inherently creates a plume that partially returns back to the downstream side of the deceleration grid 230 and, in some instances, to the acceleration grid 220 and even the screen grid 210; these return plumes are shown as plumes 261, 262, 263. Material from the plumes 261, 262, 263 strikes and thus deposits on the downstream side of the deceleration grid 230, but may also deposit on the downstream sides of the grids 210, 220 and also on the upstream sides of the grids 210, 220, 230.

As the thickness of the material on the downstream side of the grids 210, 220, 230 increases, the chances of the material delaminating or flaking off increases, thus creating particulate contaminants in the chamber. To inhibit the redeposited material from flaking off and producing possible particulate contaminant and potential arcing, the material is etched off, in situ, by the system. This etching of the redeposited material, or conditioning, may be done on a regular schedule (e.g., every 100 cycles, every 500 cycles) or may be scheduled when the material is estimated or determined (e.g., measured) to be a predetermined thickness.

To etch the redeposited material off from the downstream side of the grid 230, and also off the grids 210, 220, a negative bias is applied to the grid 230 while still providing ions from the ion beam source 202. The negative bias on the grid 230 attracts charge exchange ions formed downstream of the grid 230 (between the grid 230 and the target 204) to etch or condition the surface of the grid 230.

The negative bias is based, e.g., on the deposited and/or etched material, rate of deposition and/or etch, and the deposition and/or etching process and will vary based on such. The negative bias applied to the grid 230 may be, e.g., from 50V to 600V, to 700V, to 800V or even to 1000V.

The negative bias may be applied for a duration measured in seconds or minutes and could be as short as 5 seconds or for as long as 3 hours (180 minutes). Example durations include 10 seconds, 30 seconds, 45 seconds, 1 minute, 2 minutes, 5 minutes, 10 minutes, 30 minutes, 45 minutes, 60 minutes, 120 minutes, 180 minutes, and any time duration in between. The negative bias may be applied continuously or may be pulsed, or may be stepped or oscillated (e.g., between, e.g., 50V and 500V at 10 second intervals).

One example set of conditioning parameters has 700V (screen grid voltage), 500V (accelerator grid voltage), 450 mA (beam current) and 500V (deceleration grid voltage–the negative bias) for 15 min.

In addition to the application of the negative bias to the grid, one or more system parameters may be adjusted. For example, any or all of the following parameters may be increased or decreased, depending on the type of conditioning that the system needs: the chamber pressure of the system, the extraction current in the ion beam source, the R value (which is a measure of controlling beam divergence, where R is screen grid voltage/(screen grid voltage+accelerator grid voltage), or, $R=V_s/(V_s+V_a)$), and perveance, which determines the space charge limitation for each hole or aperture in a grid.

Figure 3:
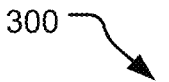
FIG. 3 is a flowchart of a stepwise example method for conditioning a grid.
Figure 3:
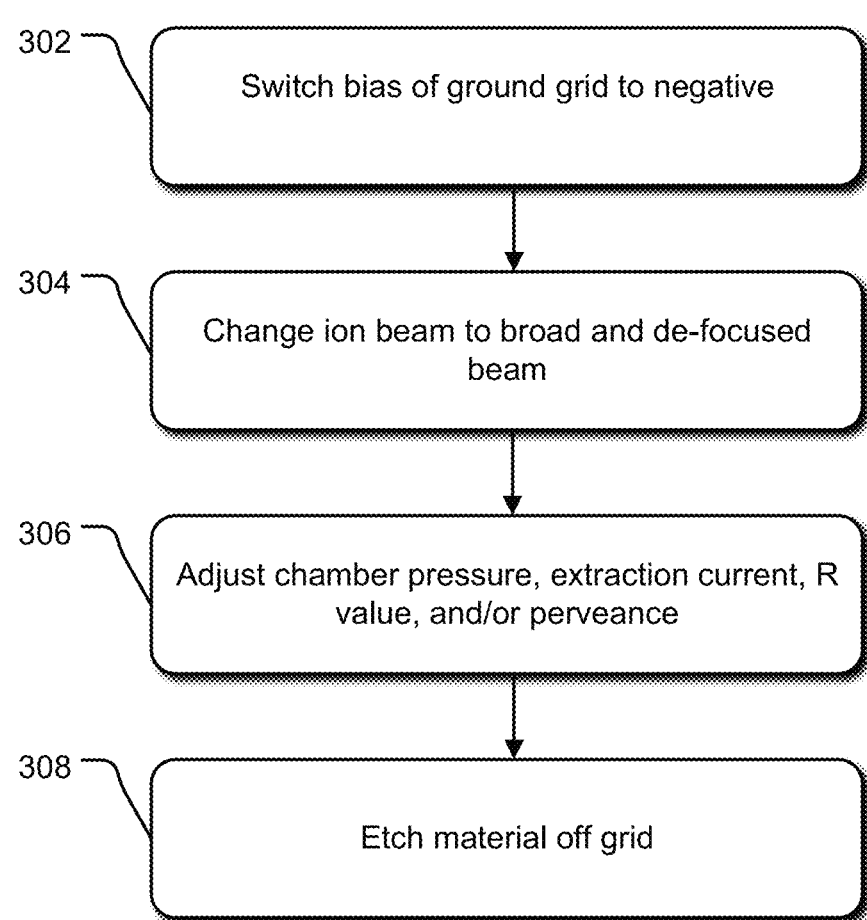

FIG. 3 shows a general method 300 for conditioning a grid in an ion beam system. In a first step 302, the bias of the deceleration grid is switched from neutral or ground to negative. In a second step 304, the ion beam is changed from a high focused beam to a broad and defocused beam. In a third step 306, one or more of the chamber pressure, the extraction current in the ion beam source, the R value, or the perveance is adjusted. In a fourth step 308, the material on the deceleration grid is etched, at least off the back side (downstream side) but also possibly off the front side (upstream side). The etch rate may vary at different locations of the deceleration grid and the other grids and can be tuned by the parameters.

In one particular experimental example, a tungsten (W) target was placed in an ion beam system. Tungsten material was deposited onto a witness sample to a thickness of 180 Å at a first test location and 216 Å at a second test location with beam parameters of $V_s$=650 V, $V_a$=250 V, and $I_b$=450 mA extraction current for a duration of 15 minutes with the deceleration grid at $V_a$=−340. An average etch rate of 10 Å/min was achieved.

In another example to condition the grid, a negative bias of $V_d$=−500 V was applied on the deceleration grid for 5 minutes, and the screen voltage was increased to 700 V, the accelerator voltage was increased to 450 V, and the extraction current was increased to $I_b$=600 mA. An average etch rate of 33 Å/min for the deceleration grid was achieved.

Figure 4A:
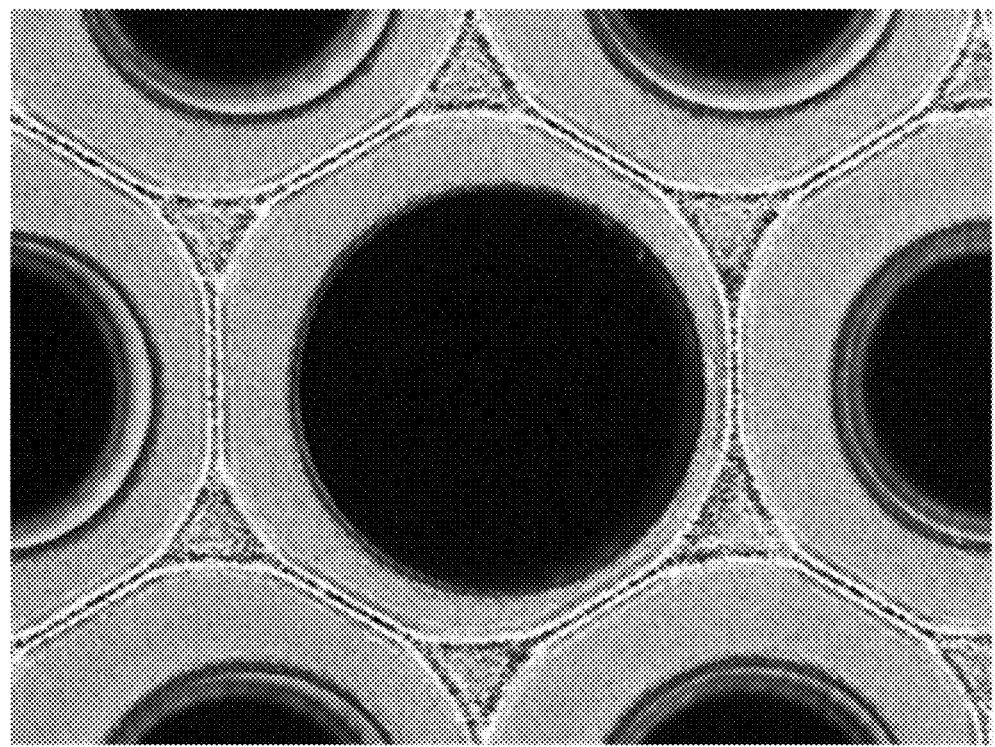
FIGS. 4A and 4B are optical photomicrographs of a conditioned grid.
Figure 4B:
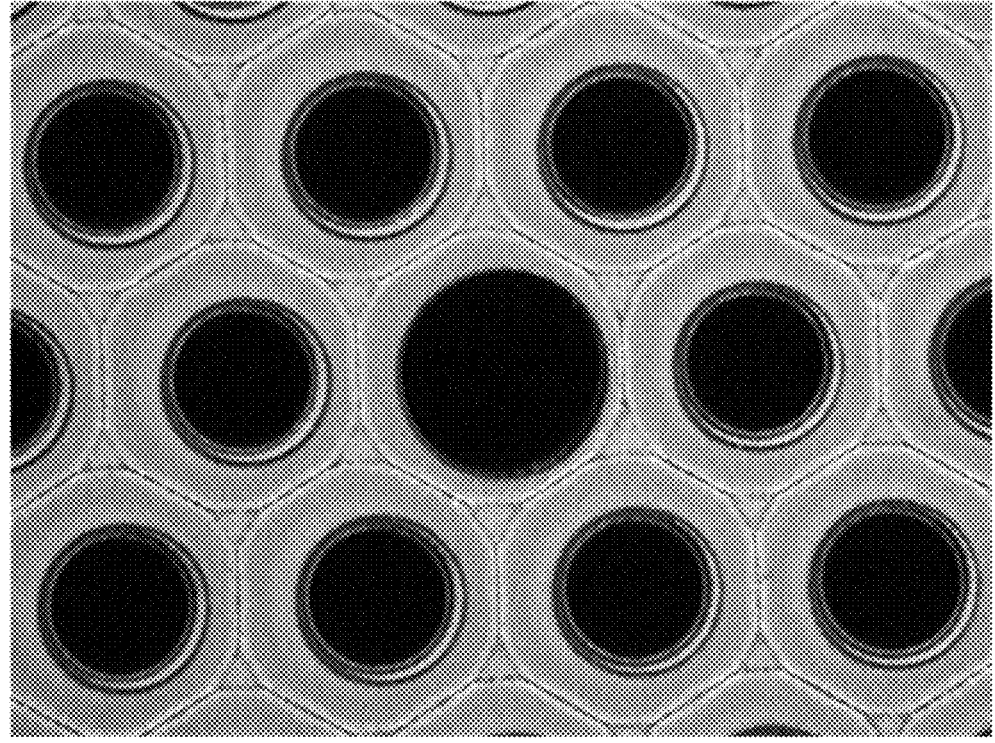

FIGS. 4A and 4B show two photographs of a deceleration grid conditioned according to a method described herein, the photographs focused on multiple holes present through the grid, with FIG. 4A being an enlarged partial view of FIG. 4B. Upon review of the conditioned grid, it is seen that the periphery of the holes was not etched and no change in hole diameter was observed, but a pit and groove texture was observed on the grid; the texture can further improve the grid life.

In FIGS. 4A and 4B, the hexagonal pattern shows the etched area, with the hexagon corners being the deepest part. The position of the center of the hexagon with respect to center line of the hole is an indication of hole alignment across multiple grids. If the hexagon center and the hole exactly overlap, the holes of multiple grids are perfectly aligned; if not, there is some misalignment across grids. Therefore, this method, in addition to cleaning the deceleration grid, can provide feedback for the design of complex grids, to align or offset the holes on multiple grids (e.g., the screen grid, the acceleration grid, and the deacceleration grid).

As indicated, the particular operating parameters of the conditioning process are determined by the conditions and parameters of the ion beam process (e.g., deposition and/or etching) itself. A skilled operator of the ion beam system would be able to determine the desired conditioning parameters for the particular deposited material based on its deposition parameters.

Grid conditioning, per these processes of applying a negative bias to the deceleration grid, provides numerous benefits. The grid conditioning prolongs the life of the grids in an in situ manner, without the need to break the system vacuum. The risk of creating grid-emanated contamination is greatly reduced and possibly eliminated. The conditioning processes are applicable to any gridded ion source system and are not material dependent.

In addition to the grid conditioning (removal of redeposited material) described herein, one or more of the grids may be textured or seasoned by applying a negative bias to the downstream most grid. Texturing is a well-known method of prolonging the life of the deceleration grid by roughening its surface. The roughening process provides a random change in the morphology of the grid surface, creating a pattern/texture on it. One technique for grid texturing is with a laser, where movement of the laser in a predefined manner creates a fine pattern/texture on the downstream surface of the grid. Such a texturing process is done ex situ, requiring breaking of the system vacuum.

Similar to the grid conditioning described above, grid texturing in situ can be done by applying a negative bias to a grid. A pit and groove (e.g., hexagonal) pattern is formed in the grid surface around the grid holes, the pattern effectively functioning as grid texture. The morphology of the pit and groove pattern is controllable and depends on any or all of the bias voltage, the extraction current, process pressure, R value, and perveance.

The discussion herein has been based on having three grids in the system, a screen grid, acceleration grid, and a deceleration grid, with the deceleration grid most downstream and closest to the target. The conditioning methods described herein, however, can be used in systems with any number of grids, with the negative bias being applied to the downstream most grid closest to the target.

The above specification and examples provide a complete description of the process and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. Features and elements from one implementation or embodiment may be readily applied to a different implementation or embodiment. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed:

1. A method of conditioning a grid in an ion beam system, the method comprising:

applying a negative bias to a downstream-most grid in the ion beam system;

providing a broad and defocused ion beam through the negative biased downstream-most grid; and etching redeposited material off of the downstream-most grid.

2. The method of claim 1 further comprising one or more of:

adjusting a pressure of a chamber of the ion beam system;

adjusting an extraction current of the ion beam system;

adjusting R value of the ion beam system; and adjusting perveance of the ion beam system.

3. The method of claim 2, wherein the adjusting a pressure of a chamber of the ion beam system comprises increasing the pressure.

4. The method of claim 2, wherein the adjusting an extraction current of the ion beam system comprises increasing the extraction current.

5. The method of claim 2, wherein the adjusting R value of the ion beam system comprises increasing the R value.

6. The method of claim 2, wherein the adjusting perveance of the ion beam system comprises increasing the perveance.

7. The method of claim 2, wherein the adjusting a pressure of a chamber of the ion beam system comprises decreasing the pressure.

8. The method of claim 2, wherein the adjusting an extraction current of the ion beam system comprises decreasing the extraction current.

9. The method of claim 2, wherein the adjusting R value of the ion beam system comprises decreasing the R value.

10. The method of claim 2, wherein the adjusting perveance of the ion beam system comprises decreasing the perveance.

11. The method of claim 1, wherein applying a negative bias comprises applying a negative voltage of between 50V and 800V for at least 30 seconds.

12. The method of claim 11, wherein applying a negative voltage is for up to 180 minutes.

13. The method of claim 1, wherein the method is done between substrate processing without opening the ion beam system.

14. The method of claim 1, wherein the method is done without removing the downstream-most grid from the ion beam system.

15. A method of in situ conditioning a grid in a chamber of an ion beam system after processing a substrate, the method at a chamber pressure, at an extraction current, at an R value, at a perveance, and comprising:

applying a negative bias to a downstream-most grid in the ion beam system;

adjusting one or more of the chamber pressure, the extraction current, the R value, and the perveance; and providing an ion beam through the negative biased downstream-most grid.

16. The method of claim 15, further comprising etching redeposited material off of the grid.

17. The method of claim 15, wherein providing an ion beam through the negative biased grid comprises providing a broad and defocused ion beam.

18. The method of claim 15, wherein applying a negative bias comprises applying a negative voltage of between 50V and 800V for at least 30 seconds.

19. The method of claim 18, wherein applying a negative voltage is for up to 180 minutes.

20. A method for positioning multiple grids in an ion beam system, the multiple grids having a plurality of holes therethrough and located between an ion beam source and a target, the method comprising:

applying a negative bias to a downstream-most grid in the ion beam system, the downstream-most grid closest to the target;

providing an ion beam through the negative biased grid to condition the negative biased grid and produce a hexagon pattern on a surface of the conditioned negative biased grid; and determining if centers of the plurality of holes in the conditioned negative biased grid are aligned with centers of hexagons of the hexagon pattern.

21. The method of claim 20, further comprising:

dependent upon determining the centers of the plurality of holes are not aligned with the centers of the hexagons, adjusting a position of at least one of the multiple grids.

* * * * *